(12) United States Patent
Umino et al.

(10) Patent No.: US 11,516,949 B2
(45) Date of Patent: Nov. 29, 2022

(54) POWER CONVERTOR

(71) Applicant: Nissan Motor Co., Ltd., Kanagawa (JP)

(72) Inventors: Tomohiro Umino, Kanagawa (JP); Soichi Ishii, Kanagawa (JP)

(73) Assignee: Nissan Motor Co., Ltd., Kanagawa (JP)

(*) Notice: Subject to any disclaimer, the term of this patent is extended or adjusted under 35 U.S.C. 154(b) by 0 days.

(21) Appl. No.: 16/980,260

(22) PCT Filed: Mar. 13, 2018

(86) PCT No.: PCT/JP2018/009692
§ 371 (c)(1),
(2) Date: Sep. 11, 2020

(87) PCT Pub. No.: WO2019/175958
PCT Pub. Date: Sep. 19, 2019

(65) Prior Publication Data
US 2021/0029851 A1 Jan. 28, 2021

(51) Int. Cl.
*H05K 7/20* (2006.01)
*H02M 7/00* (2006.01)
*H02K 5/04* (2006.01)

(52) U.S. Cl.
CPC ........... *H05K 7/20927* (2013.01); *H02K 5/04* (2013.01); *H02M 7/003* (2013.01); *H05K 7/20872* (2013.01)

(58) Field of Classification Search
CPC .. H05K 7/20927; H05K 7/20872; H02K 5/04; H02M 7/003
(Continued)

(56) References Cited

U.S. PATENT DOCUMENTS

| 2,450,170 A | * | 9/1948 | George | F16L 19/083 |
| | | | | 285/340 |
| 3,659,877 A | * | 5/1972 | Kubasta | F16B 31/021 |
| | | | | 285/368 |

(Continued)

FOREIGN PATENT DOCUMENTS

| JP | 2012-016134 A | 1/2012 |
| JP | 2012-064724 A | 3/2012 |

(Continued)

*Primary Examiner* — Anatoly Vortman
(74) *Attorney, Agent, or Firm* — Osha Bergman Watanabe & Burton LLP

(57) ABSTRACT

A power converter (100) includes a power converter circuit (1), a cooler (2), and a cover member (3). The power converter circuit is configured to convert input electric power into DC power or AC power. The power converter circuit is placed on the cooler. The cooler is configured to cool the power converter. The power converter circuit is housed between the cooler and the cover member. The cooler (2) includes a main body (20), a coolant flow passage (21), and a coolant input/output portion (22). The coolant flow passage is formed inside the main body. A coolant is circulatable through the coolant flow passage. The coolant input/output portion is coupled to the coolant flow passage. The coolant input/output portion includes a coolant introduction pipe (22a) and a coolant discharge pipe (22b). The coolant introduction pipe introduces the coolant from outside the cooler. The coolant discharge pipe discharges the coolant to outside the cooler. The coolant input/output portion (22) is joined to the main body. The joined part (23) has a joining strength lower than a strength of the main body.

9 Claims, 13 Drawing Sheets

(58) Field of Classification Search
USPC .......................................................... 361/699
See application file for complete search history.

(56) References Cited

U.S. PATENT DOCUMENTS

| | | | | |
|---|---|---|---|---|
| 4,022,497 | A * | 5/1977 | Kotsakis | F16L 19/14 |
| | | | | 285/341 |
| 4,833,567 | A * | 5/1989 | Saaski | F28D 15/046 |
| | | | | 165/104.33 |
| 4,917,149 | A * | 4/1990 | Grantham | B67D 7/3218 |
| | | | | 137/614.03 |
| 4,944,534 | A * | 7/1990 | Kotyk | F16L 19/14 |
| | | | | 285/341 |
| 4,975,766 | A * | 12/1990 | Umezawa | G01K 1/16 |
| | | | | 257/714 |
| 5,023,695 | A * | 6/1991 | Umezawa | H01L 23/4735 |
| | | | | 257/714 |
| 5,316,075 | A * | 5/1994 | Quon | F28F 13/02 |
| | | | | 257/E23.098 |
| 5,448,108 | A * | 9/1995 | Quon | H01L 23/473 |
| | | | | 361/720 |
| 5,959,351 | A * | 9/1999 | Sasaki | H01L 23/473 |
| | | | | 257/E23.098 |
| 6,367,543 | B1 * | 4/2002 | Calaman | F28F 3/022 |
| | | | | 257/E23.098 |
| 6,550,263 | B2 * | 4/2003 | Patel | H01L 23/4735 |
| | | | | 165/80.4 |
| 6,986,382 | B2 * | 1/2006 | Upadhya | H01L 23/473 |
| | | | | 174/15.1 |
| 6,994,151 | B2 * | 2/2006 | Zhou | H01L 23/427 |
| | | | | 174/15.1 |
| 7,380,409 | B2 * | 6/2008 | Campbell | H05K 7/20772 |
| | | | | 165/80.4 |
| 7,849,914 | B2 * | 12/2010 | Di Stefano | H01L 23/473 |
| | | | | 165/80.4 |
| 9,587,769 | B2 * | 3/2017 | Ishikawa | B60H 1/00571 |
| 2003/0131972 | A1 * | 7/2003 | Cosley | F28F 3/12 |
| | | | | 257/E23.098 |
| 2004/0085732 | A1 * | 5/2004 | Cox | G06F 1/206 |
| | | | | 361/696 |
| 2005/0111188 | A1 * | 5/2005 | Bhattacharya | H01L 23/427 |
| | | | | 361/708 |
| 2007/0050980 | A1 * | 3/2007 | Vetter | B23K 11/14 |
| | | | | 257/E23.098 |
| 2007/0076374 | A1 * | 4/2007 | Mongia | H01L 23/473 |
| | | | | 257/E23.098 |
| 2008/0093054 | A1 * | 4/2008 | Tilton | H05K 7/20681 |
| | | | | 137/861 |
| 2011/0079376 | A1 * | 4/2011 | Loong | H01L 23/473 |
| | | | | 165/185 |
| 2014/0085823 | A1 * | 3/2014 | Campbell | H05K 7/20236 |
| | | | | 361/689 |
| 2015/0152987 | A1 * | 6/2015 | Ishikawa | H05K 7/20927 |
| | | | | 285/350 |
| 2015/0189790 | A1 * | 7/2015 | Tachibana | H05K 7/20927 |
| | | | | 361/699 |
| 2016/0081178 | A1 * | 3/2016 | D'Onofrio | H05K 7/20218 |
| | | | | 361/699 |
| 2016/0129792 | A1 * | 5/2016 | Gohara | B60K 1/00 |
| | | | | 29/890.035 |

FOREIGN PATENT DOCUMENTS

| | | |
|---|---|---|
| JP | 2014-225938 A | 12/2014 |
| JP | 2015-149825 A | 8/2015 |
| JP | 2016-042532 A | 3/2016 |
| JP | 2017-103983 A | 6/2017 |

* cited by examiner

POWER CONVERTOR

TECHNICAL FIELD

The present invention relates to a power converter.

BACKGROUND ART

In order to improve durability against an external force input to a coolant introduction pipe and a coolant discharge pipe to introduce coolant from outside or discharge the coolant in a cooler provided with a power converter, JP2014-225938A has disclosed a structure in which the coolant introduction pipe and the coolant discharge pipe are coupled to one another with a coupling plate and are fastened with bolts at a plurality of parts to a case covering the cooler via clamps.

SUMMARY OF INVENTION

However, since the coolant introduction pipe and the coolant discharge pipe are fixed to the case using the coupling plate and the clamps in the above-described power converter, a space required to dispose the power converter in the case increases, thereby increasing a size of the entire case. Additionally, each of the coupling plate, the clamps, and the case need to have a strength enduring an external force. Therefore, expensive members having these strengths are required and this results in a cost increase.

Further, the above-described power converter improves the durability by dispersing the external force input to the coolant introduction pipe and the coolant discharge pipe into the entire cooler including the case via, for example, the clamps. In view of this, in a case where the input external force is large, not only the coolant introduction pipe and the coolant discharge pipe but also the cooler main body is possibly damaged.

An object of the present invention is to provide a technique that prevents damage of a cooler main body without a need for a member, such as a coupling plate and a clamp, even in a case where an external force input to a coolant introduction pipe and a coolant discharge pipe is large.

A power converter according to one aspect of the present invention includes a power converter circuit, a cooler, and a cover member. The power converter circuit is configured to convert the input electric power into DC power or AC power. The power converter circuit is placed on the cooler. The cooler is configured to cool the power converter. The power converter circuit is housed between the cooler and the cover member. The cooler includes a main body, a coolant flow passage, and a coolant input/output portion. The coolant flow passage is formed inside the main body. A coolant is circulatable through the coolant flow passage. The coolant input/output portion is coupled to the coolant flow passage. The coolant input/output portion includes a coolant introduction pipe and a coolant discharge pipe. The coolant introduction pipe introduces the coolant from outside the cooler. The coolant discharge pipe discharges the coolant to outside the cooler. The coolant input/output portion is joined to the main body. The joined part has a joining strength lower than a strength of the main body.

The following describes the embodiments of the present invention in detail with accompanying drawings.

DESCRIPTION OF EMBODIMENTS

First Embodiment

Figure 1:
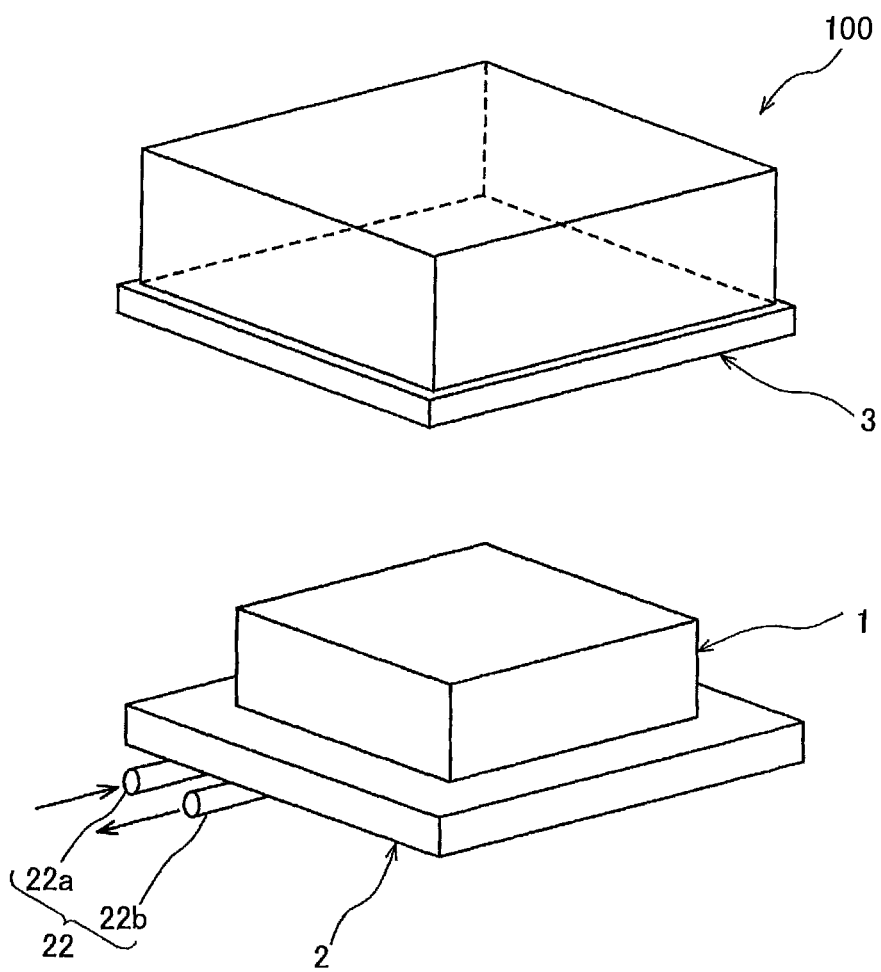
FIG. 1 is a schematic configuration diagram describing an in-car power converter of a first embodiment.

FIG. 1 is a schematic configuration diagram describing a power converter 100 of the first embodiment.

The power converter 100 includes a power converter circuit 1, a cooler 2, and a cover 3. The power converter 100 is, for example, mounted to a vehicle including a motor and functions as an in-car power converter as electric power supply means for this motor.

The power converter circuit 1 is an electric circuit, for example, an inverter that converts input electric power into predetermined electric power and outputs the predetermined electric power. The power converter circuit 1 is constituted of, for example, a semiconductor module and a smoothing capacitor. The power converter circuit 1 is electrically coupled to an external power supply via an electrical terminal (input terminal) (not illustrated) and coupled to the motor (not illustrated) via another electrical terminal (output terminal). The power converter circuit 1 converts DC power supplied from the above-described external power supply into AC power and supplies the AC power to the motor or converts AC power supplied from the motor into DC power and supplies the DC power to the external power supply.

Further, the power converter circuit 1 of this embodiment is placed on one surface (upper surface) of the cooler 2 and is fixed to the cooler 2 with, for example, a fixing bolt (not illustrated).

The cooler 2 cools the power converter circuit 1. The cooler 2 includes a coolant flow passage 21 (see FIG. 2) inside which coolant (such as cooling water) can be flowed. The cooler 2 enables heat exchange between the coolant flowing through the coolant flow passage 21 and the power converter circuit 1 to cool the power converter circuit 1. The cooler 2 includes a coolant introduction pipe 22a and a coolant discharge pipe 22b on its one surface (lower surface). The coolant introduction pipe 22a causes the coolant from outside the cooler 2 to run into the coolant flow passage 21. The coolant discharge pipe 22b discharges the coolant inside the coolant flow passage 21 to outside the cooler 2. Hereinafter, the coolant introduction pipe 22a and the coolant discharge pipe 22b are collectively referred to as "coolant input/output portion 22." Details of a configuration of the cooler 2 including the coolant input/output portion 22 will be described later with reference to FIG. 2 and the like. It should be noted that this Description designates a surface on a side of the cooler 2 where the power converter circuit 1 is disposed as an upper surface (a surface on the upper side in the drawing) and a surface on a side where the coolant input/output portion 22 is disposed as a lower surface (a surface on the lower side in the drawing).

The cover 3 functions as a housing that houses at least the power converter circuit 1 disposed on the cooler 2. The cover 3 of this embodiment has a depressed portion and is fixed to the upper surface of the cooler 2 using a fixing bolt (not illustrated) or the like such that the power converter circuit 1 is housed in this depressed portion. That is, in the power converter 100 of this embodiment, the cover 3 and the cooler 2 function as the housing that houses the power converter circuit 1. That is, the cooler 2 may be configured to have an additional function by acting as a part of the housing that houses the power converter circuit 1, in addition to the above-described cooling function. It should be noted that, the cover 3 may be configured to cover the lower surface side, not only the upper surface of the cooler 2. In this case, the cover 3 functions as the housing that houses both the power converter circuit 1 and the cooler 2. Although not illustrated, the cover 3 has a hole portion through which a power line coupling the power converter circuit 1 and the external power supply or the like pass when the cover 3 is fixed to the cooler 2.

Figure 2A:
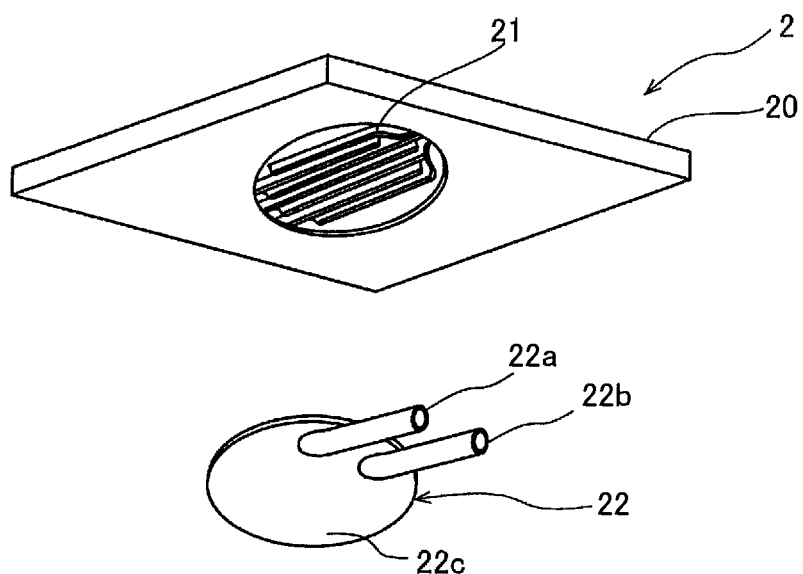
FIG. 2A is a drawing describing components of a cooler.
Figure 2B:
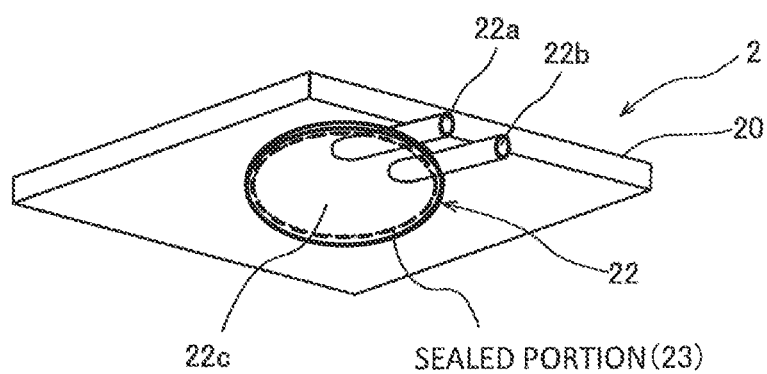
FIG. 2B is a drawing describing a configuration of the cooler.

FIG. 2A and FIG. 2B are drawings describing details of the cooler 2 of this embodiment and schematic perspective views when the cooler 2 is viewed obliquely from below. FIG. 2A is a drawing describing components of the cooler 2. FIG. 2B is a drawing describing the configuration of the cooler 2 in a state where the respective components are combined with one another.

As illustrated in FIG. 2A, the cooler 2 includes a plate-shaped main body 20, the coolant flow passage 21, and the coolant input/output portion 22. The coolant flow passage 21 is configured to circulate the coolant inside the main body 20. More specifically, the coolant flow passage 21 is formed such that the lower surface side of the main body 20 is open inside the main body 20. The coolant input/output portion 22 is joined to the lower surface of the main body 20 so as to cover the coolant flow passage 21 to allow the coolant to be held and flow inside the coolant flow passage 21. In other words, the coolant input/output portion 22 is joined to the lower surface of the main body 20 so as to cover at least the open part of the coolant flow passage 21 to form the coolant flow passage 21 that can hold and flow the coolant.

Additionally, the coolant input/output portion 22 includes the coolant introduction pipe 22a, the coolant discharge pipe 22b, and a supporting portion 22c. The coolant introduction pipe 22a introduces the coolant from outside the cooler 2 to the coolant flow passage 21. The coolant discharge pipe 22b discharges the coolant inside the coolant flow passage 21 to outside the cooler 2. The supporting portion 22c supports the coolant introduction pipe 22a and the coolant discharge pipe 22b. That is, the coolant input/output portion 22 is coupled to the coolant flow passage 21 and has a function to exchange the coolant between outside the cooler 2 and the coolant flow passage 21.

FIG. 2B illustrates the cooler 2 in a state where the coolant input/output portion 22 is joined to the main body 20. The coolant input/output portion 22 of this embodiment is joined to the main body 20 such that at least a part of distal end portions of the coolant introduction pipe 22a and the coolant discharge pipe 22b project in a surface direction of the main body 20 (outwardly beyond the side surface). The dotted line illustrated near an outer edge of the coolant input/output portion 22 in the drawing indicates a joined part 23 between the coolant input/output portion 22 and the main body 20. It should be noted that, hereinafter, this joined part 23 is also referred to as "sealed portion 23." It should be noted that, although not illustrated, hoses are mounted to the distal ends of the coolant introduction pipe 22a and the coolant discharge pipe 22b, and the coolant is exchanged between outside the cooler 2 and the coolant flow passage 21 via these hoses.

The power converter 100 assuming the above-described configuration further includes the following features. That is, with the power converter 100 of this embodiment, a joining strength of the part (sealed portion 23) where the main body 20 and the coolant input/output portion 22 constituting the cooler 2 are joined together is configured lower than a strength of the main body 20.

Specifically, for example, with the main body 20 and the coolant input/output portion 22 made of metal, the sealed portion 23 is formed by bolt fastening using a bolt made of a material having a strength lower than at least a strength of the metal forming the main body 20. Alternatively, instead of the bolt fastening, the sealed portion 23 is formed by a joining technique, such as welding and brazing, in which the joining strength is configured to be lower than at least the strength of the metal forming the main body 20.

Alternatively, with the main body 20 and the coolant input/output portion 22 made of resin, the sealed portion 23 is formed by bolt fastening using a bolt made of a material having a strength lower than at least a strength of the resin forming the main body 20. Alternatively, instead of the bolt fastening, the sealed portion 23 is formed by a joining technique, such as welding, in which the joining strength is configured to be lower than at least the strength of the resin forming the main body 20.

Alternatively, the main body 20 and the coolant input/output portion 22 may be made of different kinds of materials. For example, the main body 20 is made of metal and the coolant input/output portion 22 is made of resin. In this case, the joining is performed by bolt fastening using a bolt made of a material having a strength lower than at least a strength of the material forming the main body 20 or by a joining technique, such as joining of different kinds of materials, in which the joining strength is configured to be lower than at least a strength of the material forming the main body 20. It should be noted that, formation of at least one of the main body 20 and the coolant input/output portion 22 with resin allows weight reduction and low cost compared with formation of these portions with metal. The coolant input/output portion 22 may have the strength configured lower than the joining strength of the sealed portion 23. In this case, when an external force is input to the coolant input/output portion 22, the coolant input/output portion 22 deforms to ensure reduction of stress acting on the sealed portion 23.

As exemplified above, in the coolant input/output portion 22 of this embodiment, the joining strength of the joined part 23 (sealed portion 23) with the main body 20 is configured lower than at least the strength of the main body 20. The following describes effects obtained by the coolant input/output portion 22 of this embodiment thus configured with reference to FIG. 3.

Figure 3:
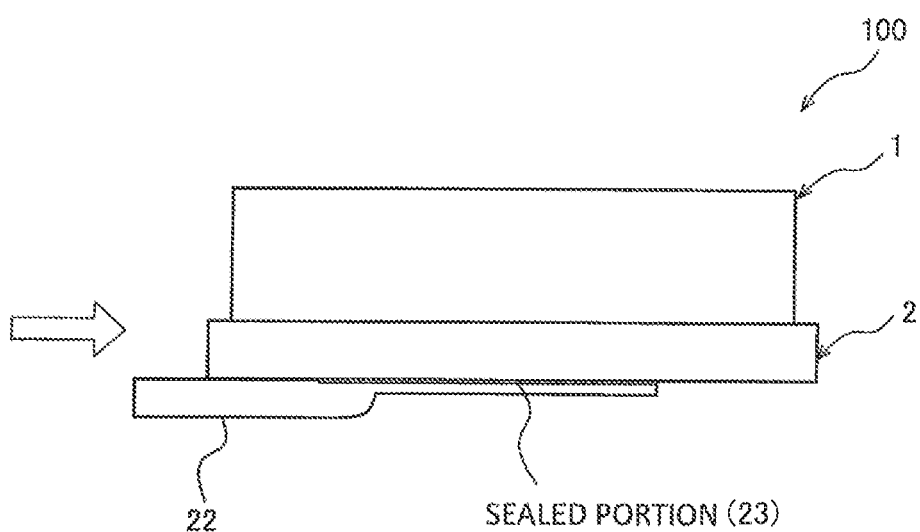
FIG. 3 is a drawing describing effects provided by the power converter of the first embodiment.

FIG. 3 is a drawing describing the effects provided by the power converter 100 of the present embodiment. FIG. 3 is a schematic configuration diagram when the power converter 100 excluding the cover 3 is viewed from the side surface. The arrow in the drawing exemplifies a principal direction of the external force input to the power converter 100 during collision or the like. The external force acting in the illustrated direction is input to the coolant input/output portion 22 via a hose (not illustrated) or the like.

At this time, since the joining strength of the sealed portion 23 is lower than the strength of the main body 20 in the power converter 100 of the present embodiment, the sealed portion 23 is released against this external force before the main body 20 is damaged. For example, in the case where the sealed portion 23 is formed by bolt fastening, due to a breakage of the bolt, such as a fracture of the bolt, the sealed portion 23 is released. For example, in the case where the sealed portion 23 is formed by welding, deposition, or the like, due to a breakage of the joined part 23 caused by, for example, separation and peeling, the sealed portion 23 is released.

That is, in the present embodiment, the part (sealed portion 23) having the low strength is purposely configured in the power converter 100, thus determining the sealed portion 23 as the broken part due to the external force. Consequently, when the external force is input to the coolant input/output portion 22, the coolant input/output portion 22 is displaced according to this external force. This allows reduction of this external force reaching a part other than the sealed portion 23 of the main body 20. As a result, damage of the main body 20 in the cooler 2 due to the external force can be avoided.

Additionally, even when the external force causes a leakage of the coolant in the coolant flow passage 21, it is ensured that the part which is broken due to the external force is the sealed portion 23. Therefore, a direction in which the coolant leaks can be limited to a downward direction (a direction toward the lower surface side of the cooler 2). Therefore, a failure of the power converter circuit 1 caused by adhesion of leaked coolant to the power converter circuit 1, which is placed on the upper surface of the cooler 2, can be avoided. Further, when the external force acts on the power converter 100, the coolant input/output portion 22 is displaced according to this external force to prevent this external force from affecting the power converter circuit 1 placed on the main body 20. Accordingly, a possibility of damage of the power converter circuit 1 due to this external force can be reduced.

As described above, the in-car power converter 100 of the present embodiment includes the power converter circuit 1, the cooler 2, and the cover member 3. The power converter circuit 1 is configured to convert the input electric power into DC power or AC power. The power converter circuit 1 is placed on the cooler 2. The cooler 2 is configured to cool the power converter 1. The power converter circuit 1 is housed between the cooler 2 and the cover member 3. The cooler 2 includes the main body 20, the coolant flow passage 21, and the coolant input/output portion 22. The coolant flow passage 21 is formed inside the main body 20. The coolant is circulatable through the coolant flow passage 21. The coolant input/output portion 22 is coupled to the coolant flow passage 21. The coolant input/output portion 22 includes the coolant introduction pipe 22a and the coolant discharge pipe 22b. The coolant introduction pipe 22a introduces the coolant from outside the cooler 2. The coolant discharge pipe 22b discharges the coolant to outside the cooler 2. The coolant input/output portion 22 is joined to the main body 20. The joined part 23 (sealed portion 23) has the joining strength lower than the strength of the main body 20.

The in-car power converter 100 of the present embodiment includes the power converter circuit 1, the cooler 2, and the cover member 3. The power converter circuit 1 is configured to convert the input electric power into DC power or AC power. The power converter circuit 1 is placed on the cooler 2. The cooler 2 is configured to cool the power converter 1. The power converter circuit 1 is housed between the cooler 2 and the cover member 3. The cooler 2 includes the main body 20, the coolant flow passage 21, and the coolant input/output portion 22. The coolant flow passage 21 is formed inside the main body 20. The coolant is circulatable through the coolant flow passage 21. The coolant input/output portion 22 is coupled to the coolant flow passage 21. The coolant input/output portion 22 includes the coolant introduction pipe 22a and the coolant discharge pipe 22b. The coolant introduction pipe 22a introduces the coolant from outside the cooler 2. The coolant discharge pipe 22b discharges the coolant to outside the cooler 2. The coolant input/output portion 22 is joined to the main body 20. The joined part 23 (sealed portion 23) between the coolant input/output portion 22 and the main body 20 is broken prior to the main body 20 when the external force is input to the coolant input/output portion 22.

Accordingly, when the external force is input to the power converter 100, it is ensured that the part which is broken due to this external force is the sealed portion 23. Therefore, the displacement of the coolant input/output portion 22 according to this external force prevents damage of the main body of the cooler 2. Consequently, damage or failure of the power converter circuit 1, which is placed on the upper surface of the cooler 2, due to the external force input to the power converter 100 can be avoided.

Additionally, with the power converter 100 of the first embodiment, the coolant input/output portion 22 is joined to the main body 20 such that at least the distal end portions of the coolant introduction pipe 22a and the coolant discharge pipe 22b project in the surface direction of the main body. This facilitates inputting the external force input from outside the cooler 2 to the coolant introduction pipe 22a and the coolant discharge pipe 22b prior to the main body 20, thereby further ensuring reduction of a possibility of the external force acting on the main body 20.

With the power converter 100 of the first embodiment, the power converter circuit 1 is placed on the upper surface of the main body 20. The coolant input/output portion 22 is joined to the lower surface of the main body 20. This limits the direction in which the coolant leaks to a downward direction (the direction toward the lower surface side of the cooler 2). Therefore, the adhesion of leaked coolant to the power converter circuit 1, which is placed on the upper surface of the cooler 2, can be avoided.

With the power converter 100 of the first embodiment, at least one of the main body 20 and the coolant input/output portion 22 is made of resin. This formation allows weight reduction and low cost compared with the formation of the main body 20 and the coolant input/output portion 22 with metal.

Second Embodiment

The following describes a power converter 200 of the second embodiment. The power converter 200 differs from that of the first embodiment in that a reinforcing member 5 is further provided. The reinforcing member 5 is configured as a member to reduce stress especially acting on the sealed portion 23 when the external force is input to the coolant input/output portion 22. The following describes the reinforcing member 5.

Figure 4A:
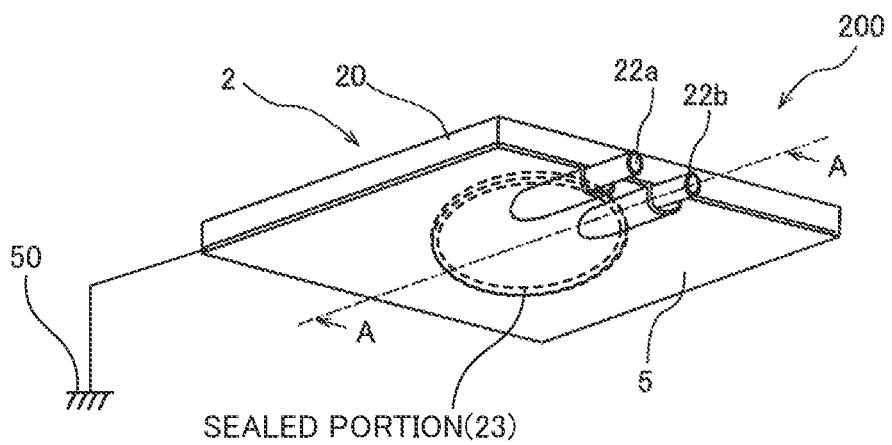
FIG. 4A is a perspective view when a cooler and a reinforcing member of a second embodiment are viewed obliquely from below.
Figure 4B:
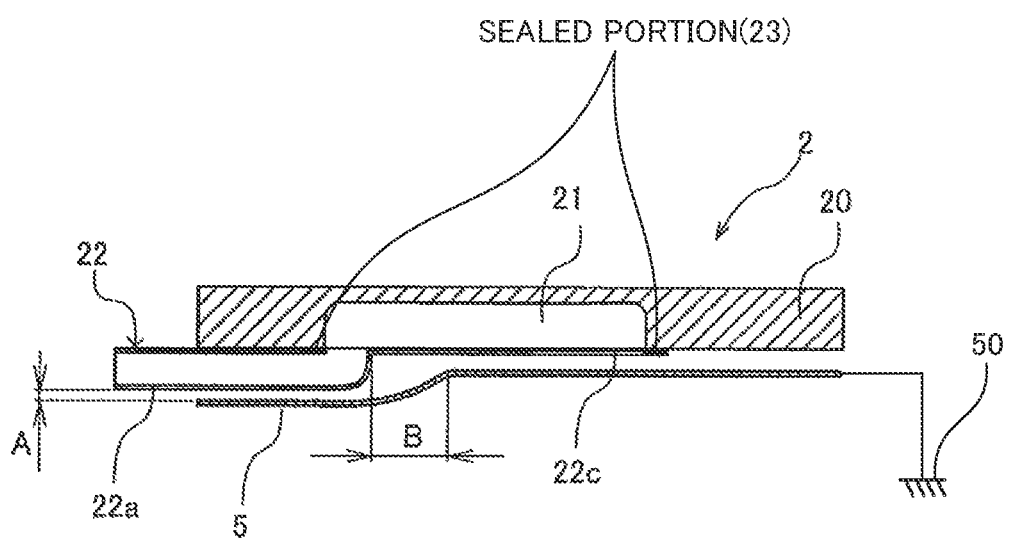
FIG. 4B is a cross-sectional view taken along A-A of the power converter illustrated in FIG. 4A.

FIGS. 4A and 4B are schematic configuration diagrams describing the reinforcing member 5 of this embodiment. FIG. 4A is a perspective view when, in the power converter 200 including the reinforcing member 5, the cooler 2 and the reinforcing member 5 are viewed obliquely from below. FIG. 4B is a cross-sectional view taken along A-A of the power converter 200 illustrated in FIG. 4A.

As illustrated in FIG. 4A, the reinforcing member 5 of the present embodiment is a plate-shaped member. The reinforcing member 5 is configured so as to cover at least a part of the coolant input/output portion 22 on the lower surface of the cooler 2. More specifically, the reinforcing member 5 covers at least a part of respective coolant introduction pipe 22a and coolant discharge pipe 22b of the coolant input/output portion 22 on the lower surface of the cooler 2. The reinforcing member 5 of the present embodiment is fixed to the lower surface of the cooler 2 with a joining strength higher than at least the joining strength of the sealed portion 23 formed with a bolt (not illustrated) or the like. The reinforcing member 5 thus covering at least a part of the coolant input/output portion 22 ensures reduction of the displacement of the coolant input/output portion 22 due to the external force when this external force acts on the coolant input/output portion 22.

FIG. 4B is a cross-sectional view taken along A-A of the power converter 200 illustrated in FIG. 4A and a cross-sectional side view of the cooler 2 and the reinforcing member 5. As illustrated in FIG. 4B, the reinforcing member 5 of the present embodiment has a clearance (clearance A) having a predetermined width in a thickness direction of the cooler 2 (an up-down direction in the drawing) from lower surfaces of the coolant introduction pipe 22a and the coolant discharge pipe 22b of the coolant input/output portion 22. Additionally, the reinforcing member 5 has a clearance (clearance B) having a predetermined width in the surface direction of the cooler 2 (the right-left direction in the drawing) from an end portion on an opposite side from an introduction port of the coolant introduction pipe 22a and a discharge port of the coolant discharge pipe 22b of the coolant input/output portion 22 in a principal input direction of the external force (the arrow direction in the drawing).

The clearances A and B may be appropriately configured. In the present embodiment, configuring the clearance A allows restricting the displacement or the deformation of the coolant introduction pipe 22a and the coolant discharge pipe 22b mainly in the thickness direction when the external force is input to the coolant input/output portion with the clearance A. Moreover, configuring the clearance B allows restricting the displacement of the coolant introduction pipe 22a and the coolant discharge pipe 22b mainly in the surface direction when the external force is input to the coolant input/output portion with the clearance B. Thus, the reinforcing member 5 allows reducing the displacement of the coolant input/output portion 22 caused by the external force within a predetermined range. Accordingly, a possibility of a breakage of the sealed portion 23 can be reduced and durability of the entire cooler 2 can be improved. As a result, the strength of the cooler 2 can be configured to be lower than that of the conventional one, achieving low cost and reduction in size. It should be noted that, the clearance A may be configured to be approximately 0 such that the reinforcing member 5 and the lower surface of the coolant input/output portion 22 nearly contact.

Meanwhile, the clearance B is not narrowed down like the clearance A but may be configured as follows. That is, as illustrated in FIG. 4B, the clearance B of the present embodiment may be configured to have a length where the displacement of the coolant input/output portion 22 in the principal input direction of the external force (the arrow direction in the drawing) is not interfered when this external force is input. The clearance B of the reinforcing member 5 thus configured allows the displacement in the principal input direction of the external force while reducing the displacement of the coolant input/output portion 22 in the thickness direction of the cooler 2. Thus, when the external force is input to the coolant input/output portion 22, the coolant input/output portion 22 is displaced in the surface direction of the cooler 2 according to this external force. Therefore, it is further ensured that the part which is broken due to the external force is the sealed portion 23. It should be noted that, while the material of the reinforcing member 5 is not especially limited, a material, such as metal, having a strength higher than at least that of the coolant input/output portion 22 is preferred.

Additionally, the reinforcing member 5 of the present embodiment may be configured to have an additional function (electromagnetic shielding function) of blocking an electromagnetic wave possibly generated in a vehicle to the power converter 200. Specifically, the reinforcing member 5 may be made of a material having a conductive property and grounded to a vehicle body 50 (electrically conducted to GND of the vehicle), as shown in FIGS. 4A and 4B. This ensures improving the durability of the cooler 2 and configuring the power converter 200 including the reinforcing member 5 having the electromagnetic shielding function. This eliminates the need for separately preparing a member having an electromagnetic shielding function and allows configuring the power converter 200 having the electromagnetic shielding function at a price lower than the conventional one. It should be noted that, without taking the improvement of the durability of the cooler 2 into consideration, the reinforcing member 5 may be made of a material at a lower price (for example, a press-worked thin walled metal plate). In that case, the reinforcing member 5 may be configured into the power converter 200 as a member independently having the electromagnetic shielding function, not the member to improve the durability of the cooler 2.

As described above, with the power converter 200 of the second embodiment, the cooler 2 includes the reinforcing member 5. The reinforcing member 5 covers at least a part of the coolant input/output portion 22. The reinforcing member 5 is the plate-shaped member. Thus, the displacement of the coolant input/output portion 22 against the external force input to the coolant input/output portion 22 can be reduced and a possibility of a breakage of the sealed portion 23 can be reduced. As a result, the durability of the entire cooler 2 can be improved.

With the power converter 200 of the second embodiment, the reinforcing member 5 has the conductive property and is grounded to the vehicle body 50. Accordingly, the reinforcing member 5 can have an additional electromagnetic shielding function, thereby eliminating the need for separately preparing the member having the electromagnetic shielding function. Consequently, the power converter 200 having the electromagnetic shielding function can be configured at a price lower than the conventional one.

With the power converter 200 of the second embodiment, between the coolant input/output portion 22 and the reinforcing member 5, the predetermined clearances (clearances A and B) are provided in the surface direction of the cooler 2 and the direction perpendicular to the surface direction. Thus, the reinforcing member 5 allows reducing the displacement of the coolant input/output portion 22 caused by the external force within the predetermined range (clearances A and B). Accordingly, a possibility of a breakage of the sealed portion 23 can be reduced and durability of the entire cooler 2 can be improved.

Third Embodiment

The following describes a power converter 300 of the third embodiment. The power converter 300 differs from that of the second embodiment in an aspect of the reinforcing member 5. The power converter 300 of the present embodiment features that a part of a motor housing 7 housing a motor 6 mounted to a vehicle is utilized as the reinforcing member 5, instead of the reinforcing member 5 as the plate-shaped member in the second embodiment.

FIG. 5A to FIG. 8B are drawings describing the motor housing 7 utilized as the reinforcing member 5 in the power converter 300 of the present embodiment. FIG. 5A to FIG. 8B mainly illustrate the motor 6, the motor housing 7 housing the motor 6, and the cooler 2 disposed on the upper surface or above the motor housing 7.

Figure 5A:
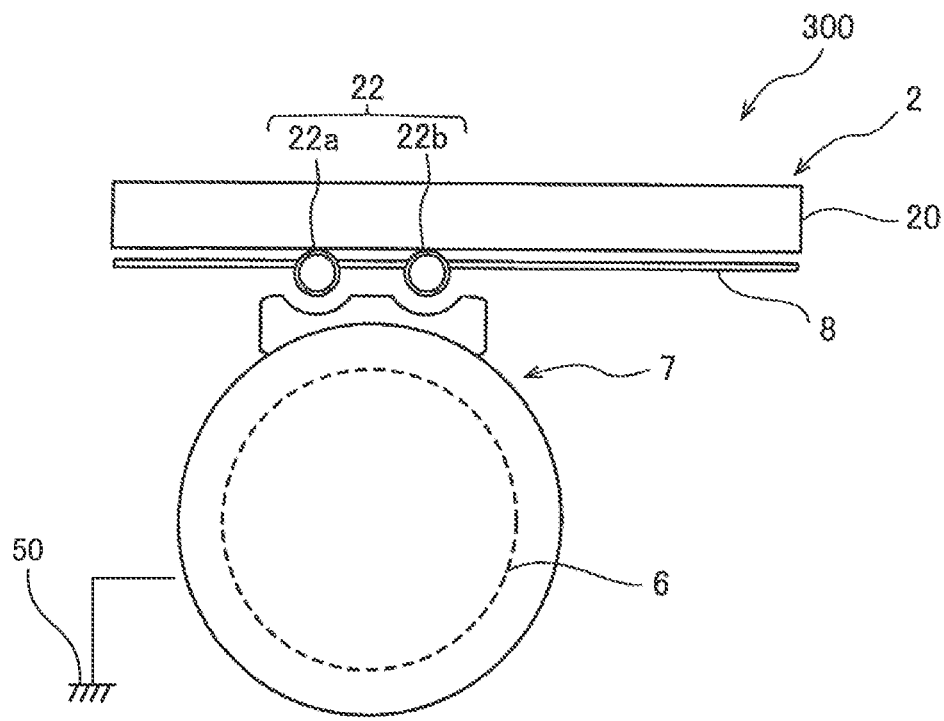
FIG. 5A is a front view when a power converter of a third embodiment is viewed from an axis direction of a motor.
Figure 5B:
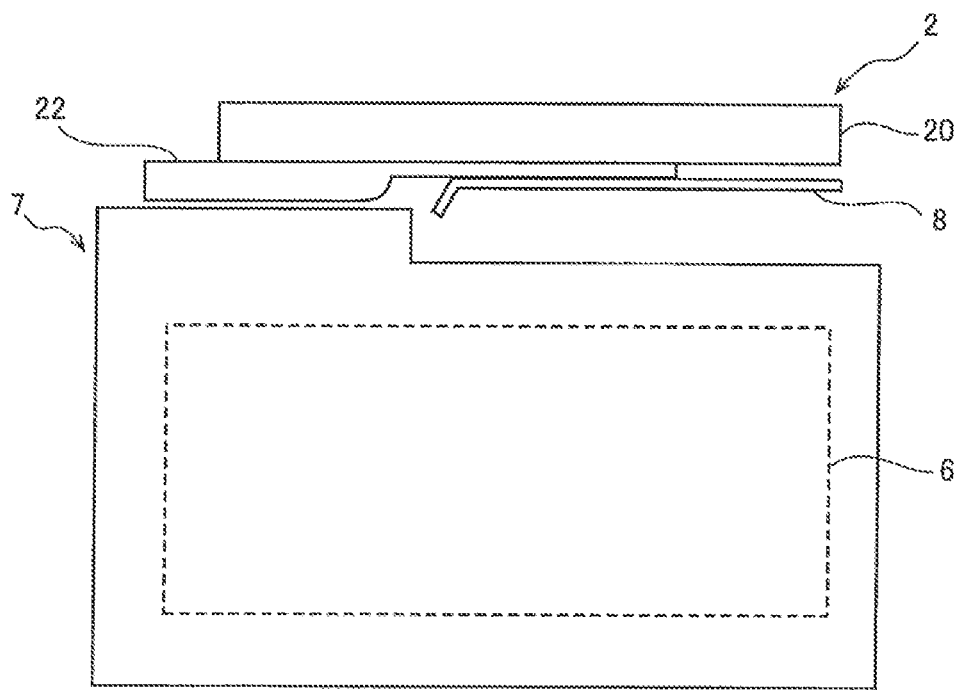
FIG. 5B is a side view when the power converter of the third embodiment is viewed from a direction perpendicular to the axis direction of the motor.

FIG. 5A and FIG. 5B are drawings describing the aspect that the motor housing 7 doubles as the reinforcing member 5 in the power converter 300. FIG. 5A is a front view when the power converter 300 is viewed from an axis direction of the motor 6. FIG. 5B is a side view when the power converter 300 is viewed from a direction perpendicular to the axis direction of the motor 6. As illustrated in the drawings, in the power converter 300, a part of the lower surface of the cooler 2, especially at least a part of the lower surfaces of the coolant introduction pipe 22a and the coolant discharge pipe 22b of the coolant input/output portion 22 are disposed close to at least a part of an upper surface of the motor housing 7. Thus, the power converter 300 is configured such that a part of the motor housing 7 plays a role as the reinforcing member 5. It should be noted that, as shown in FIGS. 5A and 5B, the motor housing 7 having the conductive property may be grounded to the vehicle body 50 to additionally have the electromagnetic shielding function similar to the reinforcing member 5 of the second embodiment.

Accordingly, regarding a layout of the vehicle body, since the power converter 300 and the motor housing 7 can be disposed to be closer, a space for mounting the power converter 300 to the vehicle can be further decreased. The motor housing 7 doubling as the reinforcing member 5 eliminates the need for separately disposing the reinforcing member as the plate-shaped member as in the second embodiment, ensuring a low cost. It should be noted that, a relative arrangement between the cooler 2 and the motor housing 7 and a shape of the upper surface of the motor housing 7 are preferably configured to provide the predetermined clearance (clearance A) according to the shape of the lower surface of the coolant input/output portion 22 as illustrated in the drawings. As illustrated in the drawings, the power converter 300 may separately include a plate-shaped member 8 covering a part other than the part covered by the motor housing 7 in the lower surface of the cooler 2. In this case, the motor housing 7 and the plate-shaped member 8 have the function of the reinforcing member 5 covering the entire lower surface of the cooler 2.

Figure 6A:
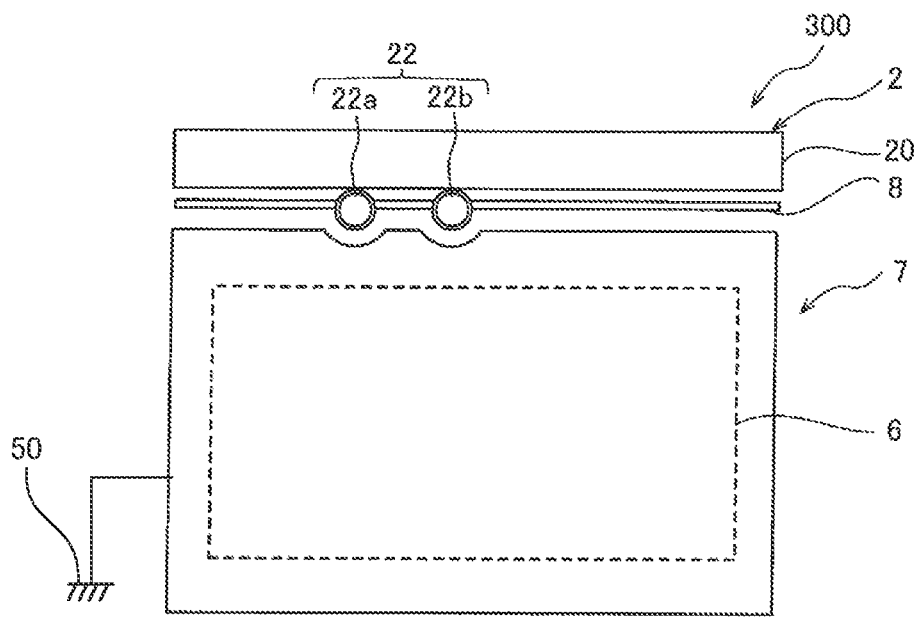
FIG. 6A is a side view when a power converter of another aspect of the third embodiment is viewed from the direction perpendicular to the axis direction of the motor.
Figure 6B:
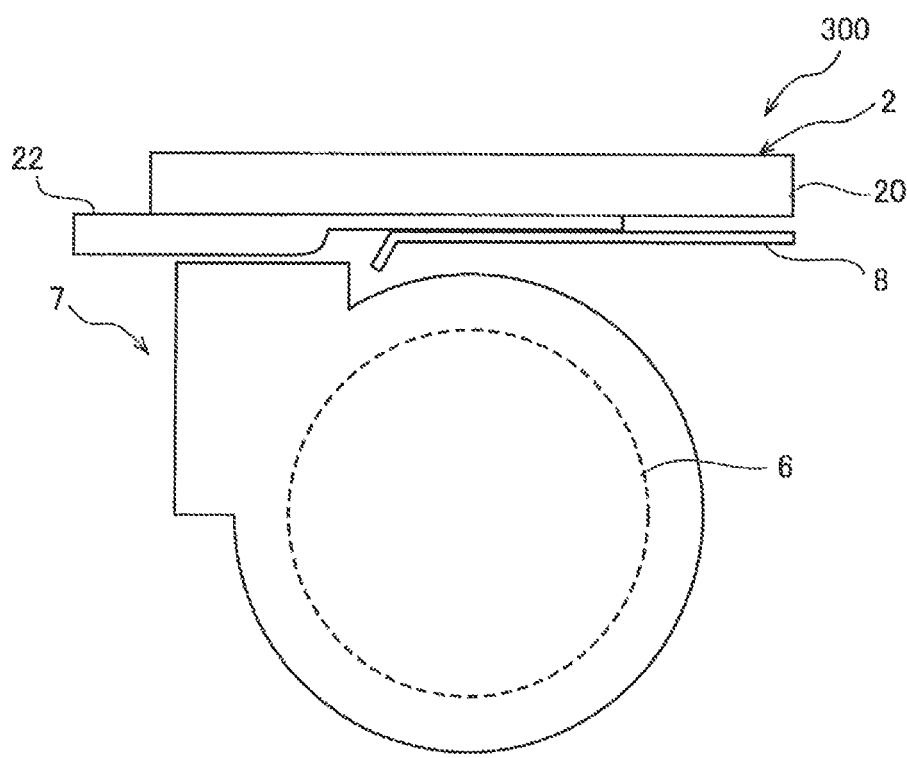
FIG. 6B is a front view when the power converter of another aspect of the third embodiment is viewed from the axis direction of the motor.

FIG. 6A and FIG. 6B are drawings describing the aspect where the motor housing 7 doubles as the reinforcing member 5 in the power converter 300 and illustrate an aspect where an arrangement of the cooler 2 relative to the motor housing 7 is rotated by 90 degrees in the surface direction compared with the arrangement of the cooler 2 illustrated in FIG. 5. Similar to FIGS. 5A and 5B, FIGS. 6A and 6B show that the motor housing 7 is grounded to the vehicle body 50. FIG. 6A is a side view when the power converter 300 is viewed from the direction perpendicular to the axis direction of the motor 6. FIG. 6B is a front view when the power converter 300 is viewed from the axis direction of the motor 6. With the aspect illustrated in FIG. 6 as well, similar to the aspect described above with reference to FIG. 5, a part of the motor housing 7 doubling as the reinforcing member 5 allows disposing the power converter 300 closer to the motor housing 7. Thus, the space for mounting the power converter 300 to the vehicle can be further decreased. That is, the relative arrangement between the cooler 2 and the motor housing 7 in the surface direction may be appropriately configured and is not specifically limited.

Figure 7A:
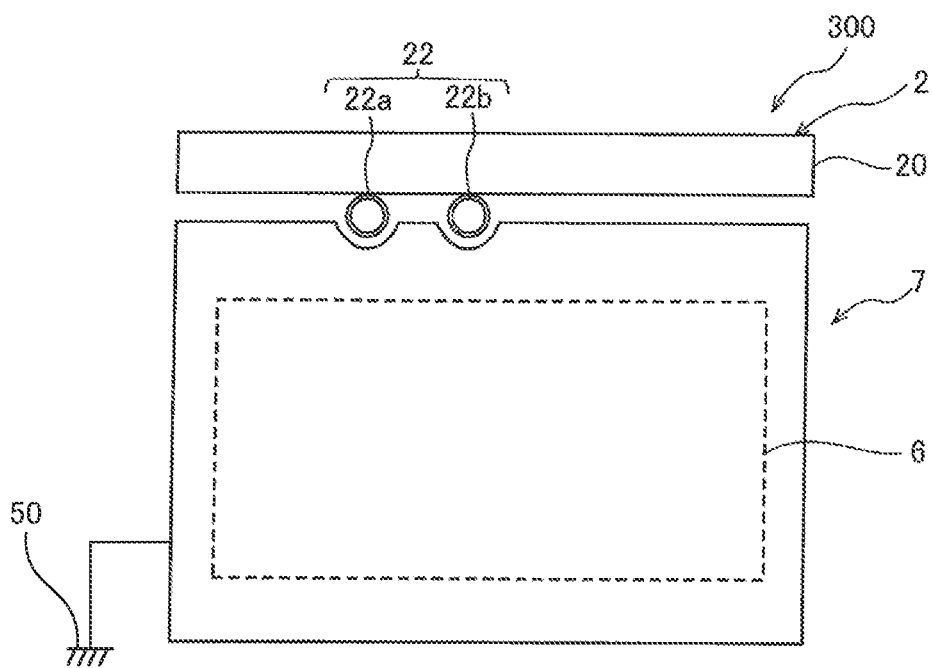
FIG. 7A is a side view when a power converter of another aspect of the third embodiment is viewed from the direction perpendicular to the axis direction of the motor.
Figure 7B:
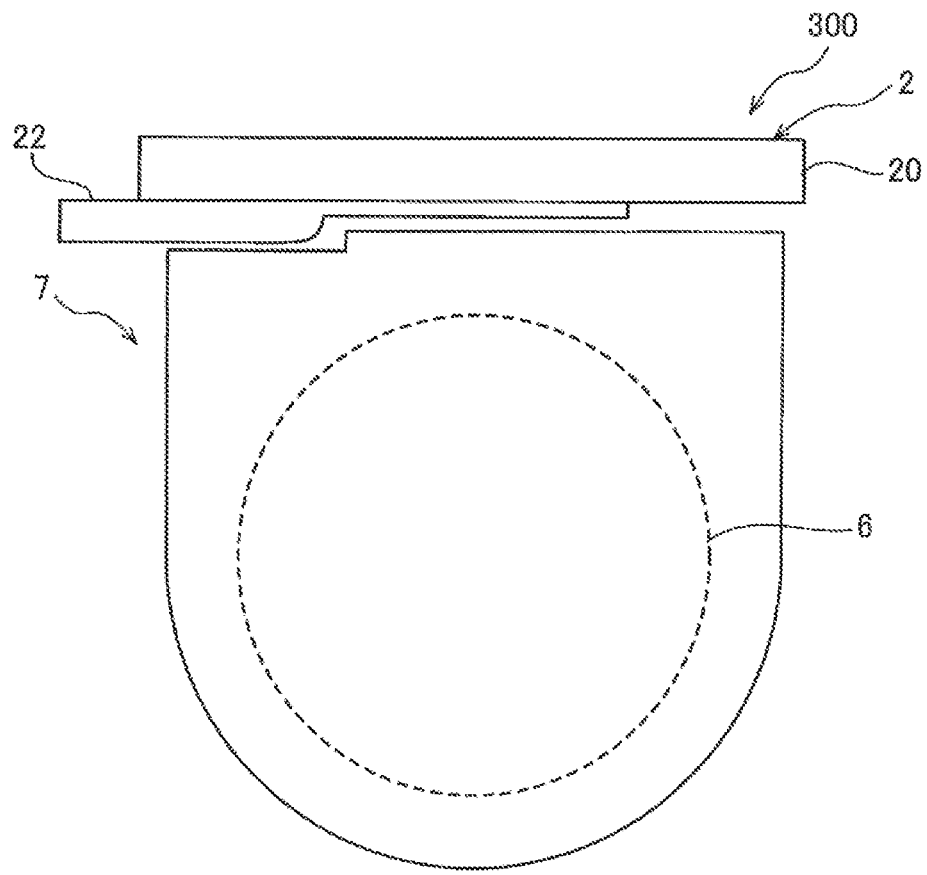
FIG. 7B is a front view when the power converter of another aspect of the third embodiment is viewed from the axis direction of the motor.

FIG. 7A and FIG. 7B are drawings describing the aspect where the motor housing 7 doubles as the reinforcing member 5 in the power converter 300. FIG. 7A is a side view when the power converter 300 is viewed from the direction perpendicular to the axis direction of the motor 6. FIG. 7B is a front view when the power converter 300 is viewed from the axis direction of the motor 6. As illustrated in the drawings, with the power converter 300, the lower surface of the cooler 2 is disposed close to the upper surface of the motor housing 7. Accordingly, a part of the motor housing 7 can play a role as the reinforcing member 5 covering the entire lower surface of the cooler 2. It should be noted that, in the exemplary embodiment shown in FIGS. 7A and 7B, the motor housing 7 having the conductive property is grounded to the vehicle body 50 to additionally have the electromagnetic shielding function similar to the configuration described above with reference to FIG. 5.

Accordingly, since the power converter 300 and the motor housing 7 can be disposed to be closer, a space for mounting the power converter 300 to the vehicle can be further decreased. The motor housing 7 doubling as the reinforcing member 5 eliminates the need for separately disposing the reinforcing member as the plate-shaped member as in the second embodiment, thus ensuring cost reduction. It should be noted that, a relative arrangement between the cooler 2 and the motor housing 7 and a shape of the upper surface of the motor housing 7 are preferably configured to provide the predetermined clearances (the clearance A and the clearance B) from the shape of the lower surface of the cooler 2 as illustrated in the drawings.

Figure 8A:
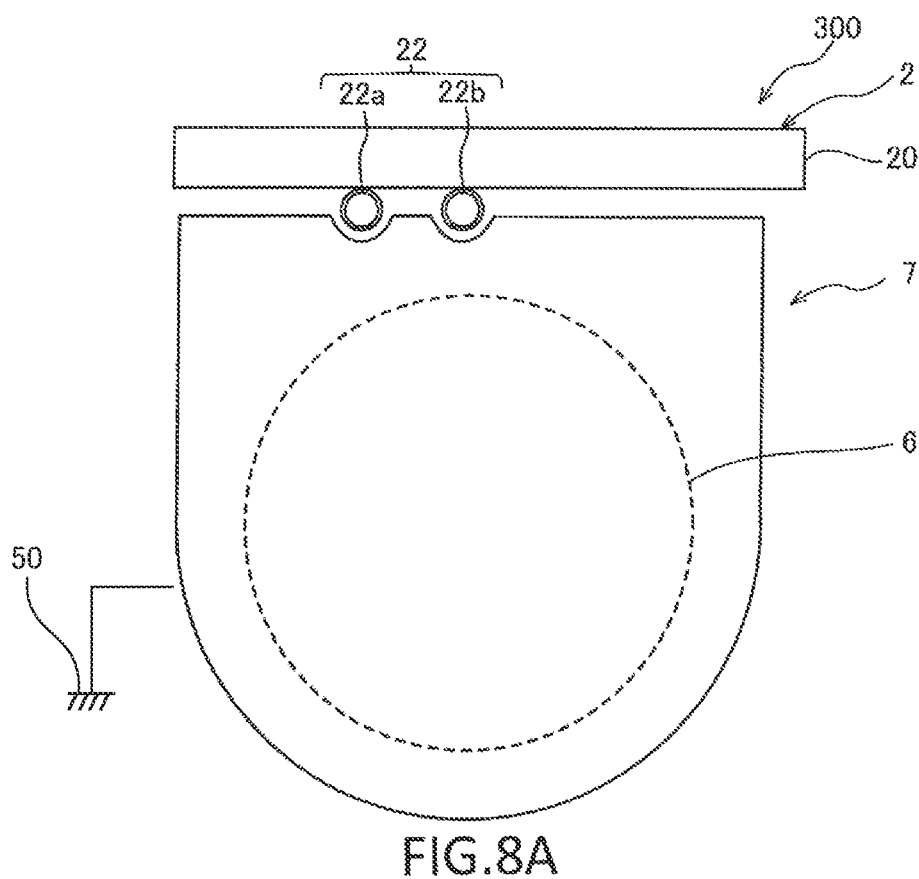
FIG. 8A is a front view when a power converter of another aspect of the third embodiment is viewed from the axis direction of the motor.
Figure 8B:
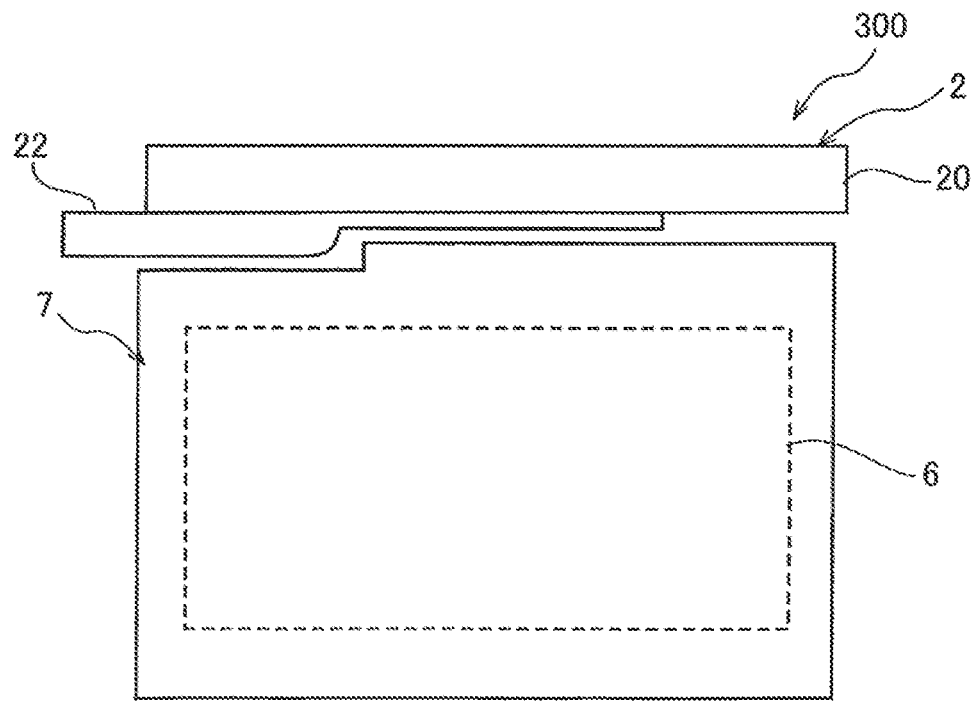
FIG. 8B is a side view when the power converter of another aspect of the third embodiment is viewed from the direction perpendicular to the axis direction of the motor.

FIG. 8A and FIG. 8B are drawings describing the aspect where the motor housing 7 doubles as the reinforcing member 5 in the power converter 300 and illustrate an aspect where an arrangement of the cooler 2 relative to the motor housing 7 is rotated by 90 degrees in the surface direction compared with the arrangement of the cooler 2 illustrated in FIG. 7. Similar to FIGS. 7A and 7B, FIGS. 8A and 8B show that the motor housing 7 is grounded to the vehicle body 50. FIG. 8A is a front view when the power converter 300 is viewed from the axis direction of the motor 6. FIG. 8B is a side view when the power converter 300 is viewed from the direction perpendicular to the axis direction of the motor 6. With the aspect illustrated in FIG. 8 as well, similar to the aspect described above with reference to FIG. 7, a part of the motor housing 7 doubling as the reinforcing member 5 allows disposing the power converter 300 closer to the motor housing 7. Thus, the space for mounting the power converter 300 to the vehicle can be further decreased.

It should be noted that, the cooler 2 and the motor housing 7 provided for the power converter 300 only need to maintain the above-described relative arrangement in the vehicle body 50, and the cooler 2 and the motor housing 7 are not necessarily directly joined. The above-described relative arrangement can be achieved by, for example, fixing each of the cooler 2 and the motor housing 7 to a part of the vehicle body (not illustrated).

As described above, with the power converter 300 of the third embodiment, the cooler 2 is disposed above the motor 6 provided for the vehicle and the reinforcing member 5 is a part of the motor housing 7 that houses the motor 6. Accordingly, regarding a layout of the vehicle body, since the power converter 300 and the motor housing 7 can be disposed to be closer, a space for mounting the power converter 300 to the vehicle can be further decreased. The motor housing 7 doubling as the reinforcing member 5 eliminates the need for separately disposing the reinforcing member as the plate-shaped member as in the second embodiment, achieving a lower cost.

Fourth Embodiment

The following describes a power converter 400 of the fourth embodiment. The power converter 400 especially features a material forming the cover 3 and provision of a rule on the relative arrangement between the cover 3 and the motor housing 7, in addition to the configuration of the power converter 300.

Figure 9A:
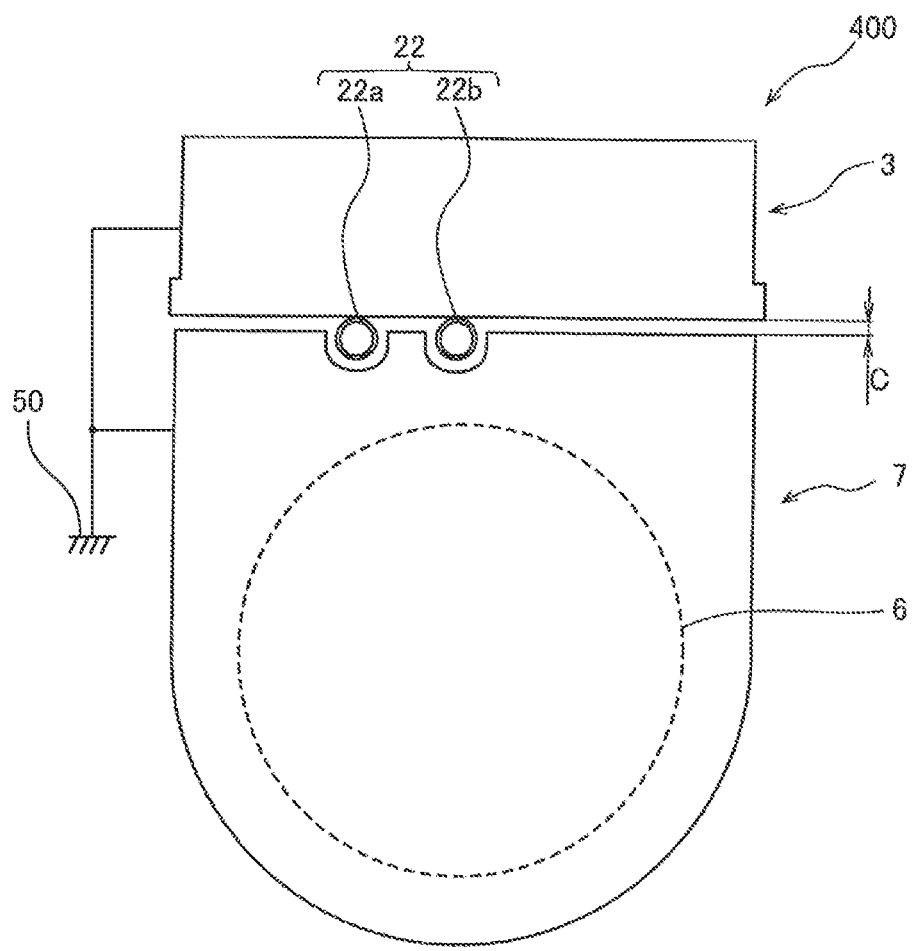
FIG. 9A is a front view when a power converter of a fourth embodiment is viewed from the axis direction of the motor.
Figure 9B:
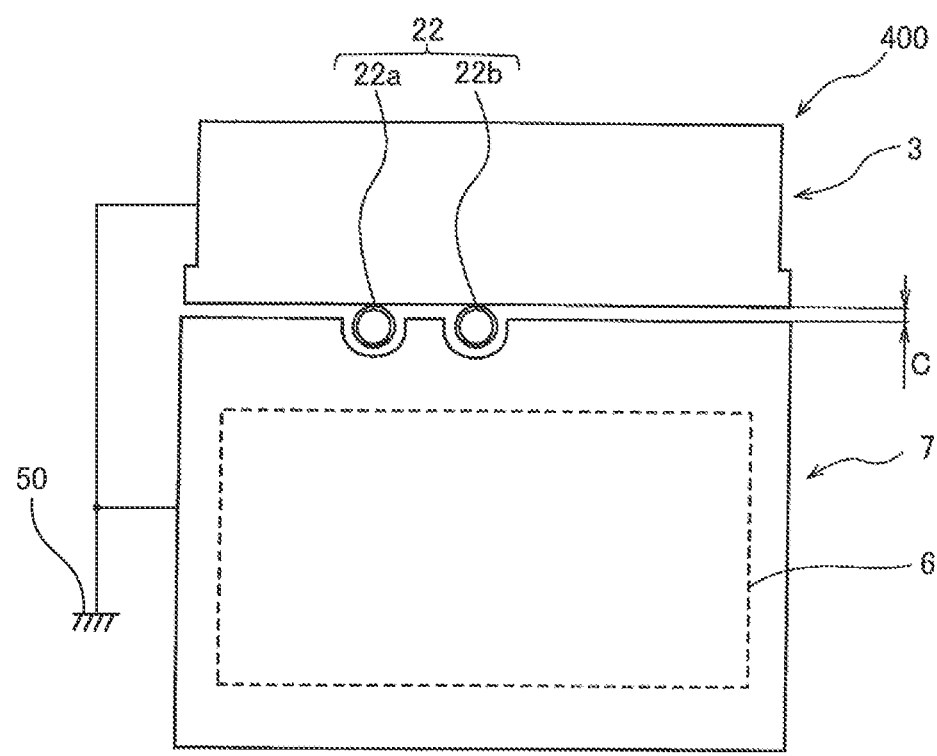
FIG. 9B is a side view when the power converter of the fourth embodiment is viewed from the direction perpendicular to the axis direction of the motor.

FIG. 9A and FIG. 9B are drawings describing the function that the cover 3 and the motor housing 7 have in the power converter 400. FIG. 9A is a front view when the power converter 400 is viewed from the axis direction of the motor 6. FIG. 9B is a side view when the power converter 400 is viewed from the direction perpendicular to the axis direction of the motor 6.

The cover 3 of the present embodiment has the conductive property and is grounded to the vehicle body 50. The motor housing 7 also has the conductive property and is grounded to the vehicle body 50. A predetermined clearance c is provided between the lower surface of the cover 3 and the upper surface of the motor housing 7. As the predetermined clearance c, a length shorter than a wavelength of an electromagnetic wave possibly generated in the vehicle, that is, an electromagnetic wave possibly input to the power converter 400 is configured. The cover 3 and the motor housing 7 thus configured allow the cover 3 and the motor housing 7 to have the electromagnetic shielding function for the power converter circuit 1 housed inside. This eliminates the need for separately including a member having the electromagnetic shielding function. Therefore, while the power converter 400 has the electromagnetic shielding function, downsizing and low cost can be further achieved compared with the conventional one. It should be noted that the relative arrangement between the cover 3 and the motor housing 7 in the surface direction may be appropriately configured and is not specifically limited.

As described above, with the power converter 400 of the fourth embodiment, the cover member 3 and the motor housing 7 have the conductive property and are grounded to the vehicle body 50. The clearance c shorter than the wavelength of the electromagnetic wave possibly generated in the vehicle is provided between the cover member 3 and the motor housing 7. This eliminates the need for separately including a member having the electromagnetic shielding function. Therefore, while the power converter 400 has the electromagnetic shielding function, downsizing and low cost can be further achieved compared with the conventional one.

While the embodiments of the present invention and their modifications have been described, the embodiments and the modifications merely describe some application examples of the present invention and not a gist to limit the technical scope of the present invention to the specific configurations of the above embodiments. The above-described embodiments and their modifications can be combined appropriately within a scope not causing inconsistency.

For example, the method for joining the main body 20 and the coolant input/output portion 22 together is not limited to the exemplified methods. As long as the joining strength of the joined part 23 (sealed portion 23) is lower than the strength of the main body 20, the joining method may be appropriately selected.

Moreover, the input of the external force to the coolant input/output portion 22 is not necessarily only the direct input to the coolant input/output portion 22 but also includes an indirect input via the hose or the like coupled to the coolant input/output portion 22. Additionally, the external force input to the coolant input/output portion 22 is not only caused by a collision or the like but includes a pressure or the like when the hose is coupled to the coolant input/output portion 22.

It should be noted that, the illustrated drawings in this description are merely the schematic diagrams. Accordingly, the configurations illustrated in the drawings are one example. As long as meeting the matters defined in the above-described description, the configurations and the aspects are not limited to those illustrated in the drawings. For example, the coolant introduction portion 22a and the coolant discharge portion 22b may be joined to the main body 20 without having the projecting parts in the surface direction of the main body 20. The coolant input/output portion 22 is not necessarily to be joined to the lower surface of the main body 20 but may be joined to the side surface or the upper surface of the main body 20. In the coolant input/output portion 22, the coolant introduction portion 22a and the coolant discharge portion 22b are not necessarily to be integrally configured but may be configured as two separate members.

Figure 10:
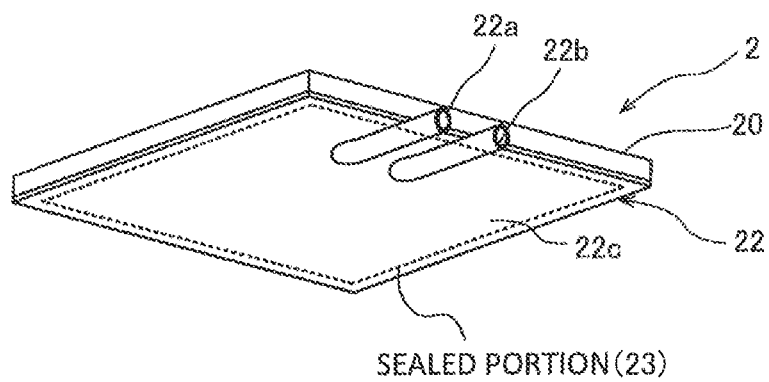
FIG. 10 is a drawing describing another aspect of a coolant input/output portion of the first embodiment.

The shape of the coolant input/output portion 22 illustrated in FIG. 2B may be, for example, an aspect as illustrated in FIG. 10. That is, as illustrated in FIG. 10, in the coolant input/output portion 22, the supporting portion 22c may cover the entire lower surface of the cooler 2. It should be noted that, in that case, the coolant input/output portion 22 may be joined to the lower surface of the cooler 2, for example, at the dotted line part illustrated in FIG. 10. Further, the coolant input/output portion 22 illustrated in FIG. 10 made of metal or the like can double as the electromagnetic shielding function similar to the reinforcing member 5.

The invention claimed is:

1. A power converter comprising:
a power converter circuit configured to convert input electric power into DC power or AC power;
a cooler on which the power converter circuit is placed to cool the power converter; and
a cover member that houses the power converter circuit between the cooler and the cover member, wherein
the cooler includes:
a main body;
a coolant flow passage formed inside the main body, a coolant being circulatable through the coolant flow passage;
a coolant input/output portion coupled to the coolant flow passage, the coolant input/output portion including a coolant introduction pipe and a coolant discharge pipe, the coolant introduction pipe introducing the coolant from outside the cooler, the coolant discharge pipe discharging the coolant to outside the cooler, and
a reinforcing member covering at least a part of the coolant input/output portion,
the coolant input/output portion is joined to the main body and a joined part between the coolant input/output portion and the main body has a joining strength lower than a strength of the main body, and
the reinforcing member is configured to restrict a displacement of the coolant input/output portion in a surface direction of the cooler and a direction perpendicular to the surface direction within limited ranges by providing predetermined clearances between the coolant input/output portion and the reinforcing member.

2. The power converter according to claim 1, wherein
the coolant input/output portion is joined to the main body such that at least distal end portions of the coolant introduction pipe and the coolant discharge pipe project in a surface direction of the main body.

3. The power converter according to claim 1, wherein
the power converter circuit is placed on an upper surface of the main body, and
the coolant input/output portion is joined to a lower surface of the main body.

4. The power converter according to claim 1, wherein
at least one of the main body and the coolant input/output portion is made of resin.

5. The power converter according to claim 1, wherein the reinforcing member is a plate-shaped member.

6. The power converter according to claim 1, wherein
the cooler is disposed above a motor provided with a vehicle, and
the reinforcing member is a part of a motor housing that houses the motor.

7. The power converter according to claim 1, wherein the reinforcing member has a conductive property and is grounded to a vehicle body.

8. The power converter according to claim 6, wherein
the cover member and the motor housing have a conductive property and are grounded to a vehicle body, a clearance shorter than a wavelength of an electromagnetic wave possibly generated in the vehicle is provided between the cover member and the motor housing.

9. A power converter comprising:
a power converter circuit configured to convert input electric power into DC power or AC power;
a cooler on which the power converter circuit is placed to cool the power converter; and
a cover member that houses the power converter circuit between the cooler and the cover member, wherein
the cooler includes:
a main body;
a coolant flow passage formed inside the main body, a coolant being circulatable through the coolant flow passage;
a coolant input/output portion coupled to the coolant flow passage, the coolant input/output portion including a coolant introduction pipe and a coolant discharge pipe, the coolant introduction pipe introducing the coolant from outside the cooler, the coolant discharge pipe discharging the coolant to outside the cooler, and
a reinforcing member covering at least a part of the coolant input/output portion,
the coolant input/output portion is joined to the main body and a joined part between the coolant input/output portion and the main body is broken prior to the main body when an external force is input to the coolant input/output portion, and
the reinforcing member is configured to restrict a displacement of the coolant input/output portion in a surface direction of the cooler and a direction perpendicular to the surface direction within limited ranges by providing predetermined clearances between the coolant input/output portion and the reinforcing member.

* * * * *